US012340985B2

(12) United States Patent
Sato (10) Patent No.: US 12,340,985 B2
(45) Date of Patent: Jun. 24, 2025

(54) PLASMA PROCESSING APPARATUS AND PLASMA PROCESSING METHOD

(71) Applicant: Tokyo Electron Limited, Tokyo (JP)

(72) Inventor: Tetsuji Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1107 days.

(21) Appl. No.: 17/160,414

(22) Filed: Jan. 28, 2021

(65) Prior Publication Data

US 2021/0249231 A1    Aug. 12, 2021

(30) Foreign Application Priority Data

Feb. 7, 2020    (JP) ................................. 2020-019757

(51) Int. Cl.
*H01J 37/32* (2006.01)
*H01L 21/683* (2006.01)
*H01L 21/687* (2006.01)

(52) U.S. Cl.
CPC .. *H01J 37/32568* (2013.01); *H01J 37/32091* (2013.01); *H01J 37/32642* (2013.01); *H01J 37/32715* (2013.01); *H01L 21/6833* (2013.01); *H01L 21/68735* (2013.01); *H01J 2237/2007* (2013.01)

(58) Field of Classification Search
None
See application file for complete search history.

(56) References Cited

U.S. PATENT DOCUMENTS 6,709,547 B1 *    3/2004   Ni .................... H01L 21/67069
                                                                    156/915
2004/0173318 A1 * 9/2004   Chou ................. H01L 21/6833
                                                                    156/345.51

(Continued)

FOREIGN PATENT DOCUMENTS

JP           2019-129123 A       8/2019

OTHER PUBLICATIONS

Cleveland, Cutler J. Morris, Christopher. (2009). Dictionary of Energy (Expanded Edition)—cap and trade. (pp. 71). Elsevier. Retrieved from <https://app.knovel.com/hotlink/pdf/id:kt007STVJ1/dictionary-energy-expanded/c-czochral-cap-trade> (Year: 2009).*

(Continued)

*Primary Examiner* — Ram N Kackar
*Assistant Examiner* — Laureen Chan
(74) *Attorney, Agent, or Firm* — XSENSUS LLP (57) ABSTRACT

A plasma processing apparatus includes a chamber, a lower electrode, an electrostatic chuck, an edge ring, a metal member, a driving unit, and a control device. The electrostatic chuck is provided on the lower electrode on which a substrate is placed. The edge ring is provided around the electrostatic chuck. The metal member is disposed along an outer wall of the lower electrode and is grounded. The driving unit moves the metal member along the outer wall of the lower electrode. The control device controls the driving unit to move the metal member so as to increase the area in which the outer wall of the lower electrode and the metal member overlap each other when viewed in a direction intersecting the surface of the outer wall of the lower electrode in accordance with an increase in the amount of wear of the edge ring.

12 Claims, 10 Drawing Sheets

(56) References Cited

U.S. PATENT DOCUMENTS

| | | | |
|---|---|---|---|
| 2007/0224709 A1* | 9/2007 | Ogasawara | H01J 37/32642 700/121 |
| 2009/0223810 A1* | 9/2009 | Dhindsa | H01J 37/21 156/345.48 |
| 2010/0203736 A1* | 8/2010 | Ichino | H01J 37/32183 257/E21.218 |
| 2010/0304572 A1* | 12/2010 | Koshimizu | H01J 37/32091 156/345.28 |
| 2012/0061351 A1* | 3/2012 | Ohata | H01J 37/32642 156/345.24 |
| 2020/0027705 A1* | 1/2020 | Kim | H01J 37/32715 |

OTHER PUBLICATIONS

Merriam-Webster Dictionary definition of central processing unit (Year: 2024).*

* cited by examiner

| DIRECTION | ED VALUE [nm/min] | | | |
|---|---|---|---|---|
| | R135-R147 | | R135-R149 | |
| | $L_{min}$ | $L_{max}$ | $L_{min}$ | $L_{max}$ |
| +X | 25.0 | 33.9 | 26.9 | 34.5 |
| −X | 28.8 | 35.4 | 30.5 | 35.0 |

FIG.9

| THRESHOLD VALUE OF CUMULATIVE TIME | AMOUNT OF RISE |
|---|---|
| $t_{th}(1)$ | $L(1)$ |
| $t_{th}(2)$ | $L(2)$ |
| ⋮ | ⋮ |
| $t_{th}(n_{max})$ | $L_{max}$ |

PLASMA PROCESSING APPARATUS AND PLASMA PROCESSING METHOD

CROSS-REFERENCE TO RELATED APPLICATION

The present application claims priority to and incorporates by reference the entire contents of Japanese Patent Application No. 2020-019757 filed in Japan on Feb. 7, 2020.

FIELD

Exemplary embodiments disclosed herein relate to a plasma processing apparatus and a plasma processing method.

BACKGROUND

In a plasma processing apparatus that applies plasma processing on a semiconductor substrate (hereinafter referred to as a substrate), the substrate is placed on a placing pedestal disposed inside a chamber. The placing pedestal includes an edge ring (also referred to as a focus ring) formed of a conductive material provided so as to surround the substrate placed on a placing surface. With the edge ring provided around the substrate, it is possible to suppress the non-uniformity of the plasma distribution between the vicinity of the center of the substrate and the vicinity of the edge of the substrate, leading to improvement of the uniformity of treatment on the substrate. Related-art example is described in Japanese Laid-open Patent Publication No. 2019-129123.

SUMMARY

According to an aspect of an embodiment, a plasma processing apparatus includes a chamber, a lower electrode, an electrostatic chuck, an edge ring, a metal member, a driving unit, and a control device. Plasma is generated inside the chamber. The electrostatic chuck is provided on the lower electrode on which a substrate is placed. The edge ring is provided around the electrostatic chuck. The metal member is disposed along an outer wall of the lower electrode and is grounded. The driving unit moves the metal member along the outer wall of the lower electrode. The control device controls the driving unit to move the metal member so as to increase an area in which the outer wall of the lower electrode and the metal member overlap each other when viewed in a direction intersecting a surface of the outer wall of the lower electrode in accordance with an increase in an amount of wear of the edge ring.

DESCRIPTION OF EMBODIMENTS

Exemplary embodiments of a plasma processing apparatus and a plasma processing method disclosed in the present application will be described in detail with reference to the accompanying drawings. Note that the following embodiments shall not limit the plasma processing apparatus and plasma processing method according to the present disclosure.

Repeating plasma processing on a substrate causes wear of the edge ring. The wear of the edge ring causes a change in the shape of the edge ring, and also causes variation in the height relationship between the plasma sheath formed above the edge ring and the plasma sheath formed above the substrate. This causes a change in an incident angle of charged particles such as ions in the plasma on the substrate.

An increase in the change in the incident angle of ions on the substrate due to wear of the edge ring makes it difficult to suppress the variation in the inclination of holes, trenches, or the like formed on the substrate by the ions within a predetermined specification. This leads to the necessity of replacing the edge ring before the variation in the inclination of the hole and the trench goes outside the predetermined specification. To replace the edge ring, the pressure in the chamber needs to be returned to atmospheric pressure in order to remove the edge ring from the chamber. Therefore, frequent replacement of the edge ring would stop the process each time, and prolonged processing stop time would lead to deterioration in productivity.

In view of this situation, the present disclosure provides a technique capable of suppressing variation of inclination of holes and trenches formed in a substrate due to wear of an edge ring.

Configuration of Plasma Processing Apparatus 1

Figure 1:
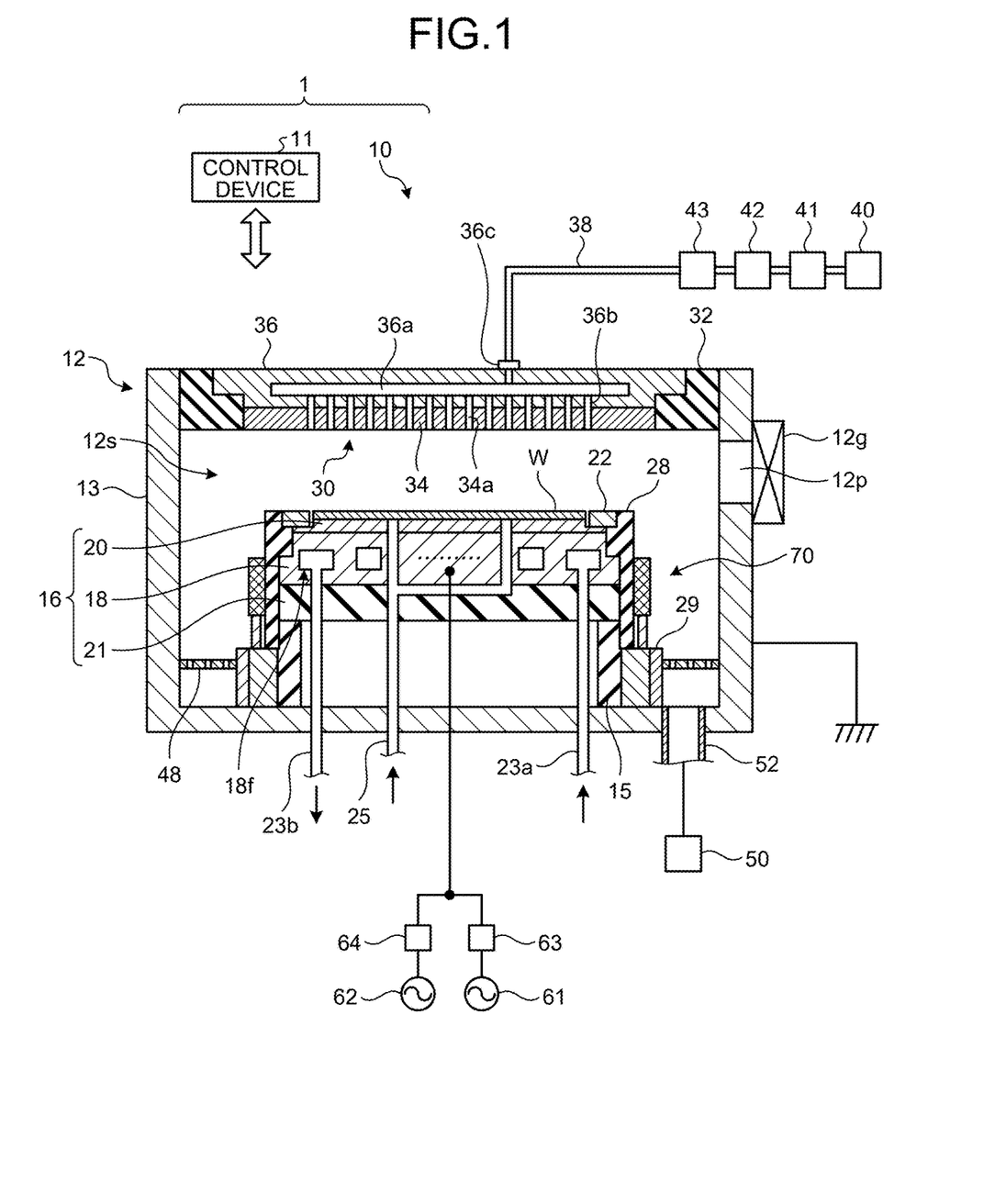
FIG. 1 is a schematic cross-sectional view illustrating an example of a plasma processing apparatus according to an embodiment of the present disclosure.

FIG. 1 is a schematic cross-sectional view illustrating an example of a plasma processing apparatus 1 according to an embodiment of the present disclosure. The plasma processing apparatus 1 in the present embodiment is a capacitively coupled plasma etching apparatus. The plasma processing apparatus 1 includes an apparatus body 10 and a control device 11 that controls the apparatus body 10.

The apparatus body 10 has a chamber 12. The chamber 12 internally includes an internal space 12s. The chamber 12 includes a case 13 formed in a substantially cylindrical shape by, for example, aluminum or the like. The internal space 12s is provided in the case 13. The case 13 is electrically grounded. The inner wall surface of the case 13, that is, the wall surface defining the internal space 12s is coated with a plasma-resistant film formed by, for example, anodizing.

On the side wall of the case 13, there is provided an opening 12p through which a substrate W passes when the substrate W is transferred between the internal space 12s and the outside of the chamber 12. Open/close operation of the opening 12p is performed by a gate valve 12g.

Inside the case 13, there is provided a support base 16 on which the substrate W is placed. The support base 16 is supported by a support portion 15 formed in a substantially cylindrical shape by an insulating material such as quartz. The support portion 15 extends upward from the bottom of the case 13.

The support base 16 has a lower electrode 18, an electrostatic chuck 20, and an insulating plate 21. The insulating plate 21 is formed in a substantially disc shape by an insulating material such as quartz. The lower electrode 18 is provided on the insulating plate 21. The lower electrode 18 is formed in a substantially disc shape by a conductive material such as aluminum.

Inside the lower electrode 18, there is provided a flow path 18f as a passage for a heat exchange medium such as chlorofluorocarbons. The heat exchange medium is supplied from a chiller unit (not illustrated) into the flow path 18f via a pipe 23a. The heat exchange medium that has circulated in the flow path 18f is returned to the chiller unit via a pipe 23b. With the configuration allowing the heat exchange medium having temperature controlled by the chiller unit to circulate through the flow path 18f, it is possible to control the temperature of the lower electrode 18.

The electrostatic chuck 20 is provided on the lower electrode 18. The substrate W is placed on the electrostatic chuck 20. The electrostatic chuck 20 includes a body formed of an insulator and an electrode formed in a film shape. A DC power supply is electrically connected to the electrode of the electrostatic chuck 20. Application of a voltage from the DC power supply to the electrode of the electrostatic chuck 20 generates an electrostatic force on the electrostatic chuck 20, and the substrate W is attracted and held on the electrostatic chuck 20 by the electrostatic force.

The electrostatic chuck 20 is provided with a pipe 25 for supplying a heat transfer gas such as He gas between the electrostatic chuck 20 and the substrate W. By controlling the pressure of the heat transfer gas supplied between the electrostatic chuck 20 and the substrate W, it is also possible to control the thermal conductivity between the electrostatic chuck 20 and the substrate W.

On an outer peripheral area of the electrostatic chuck 20, there is provided an edge ring 22 formed in an annular shape by a conductive material such as silicon. The edge ring 22 is sometimes referred to as a focus ring. The edge ring 22 is arranged so as to surround the substrate W placed on the electrostatic chuck 20.

On a side surface of the support base 16, a cover 28 formed in a substantially cylindrical shape by an insulating material is provided so as to surround the support base 16. The cover 28 protects the side surface of the support base 16 against the plasma generated in the internal space 12s. There is provided an edge adjustment mechanism 70 around the cover 28. There is also provided a cover 29 formed in a substantially cylindrical shape by an insulating material around the edge adjustment mechanism 70.

Figure 2:
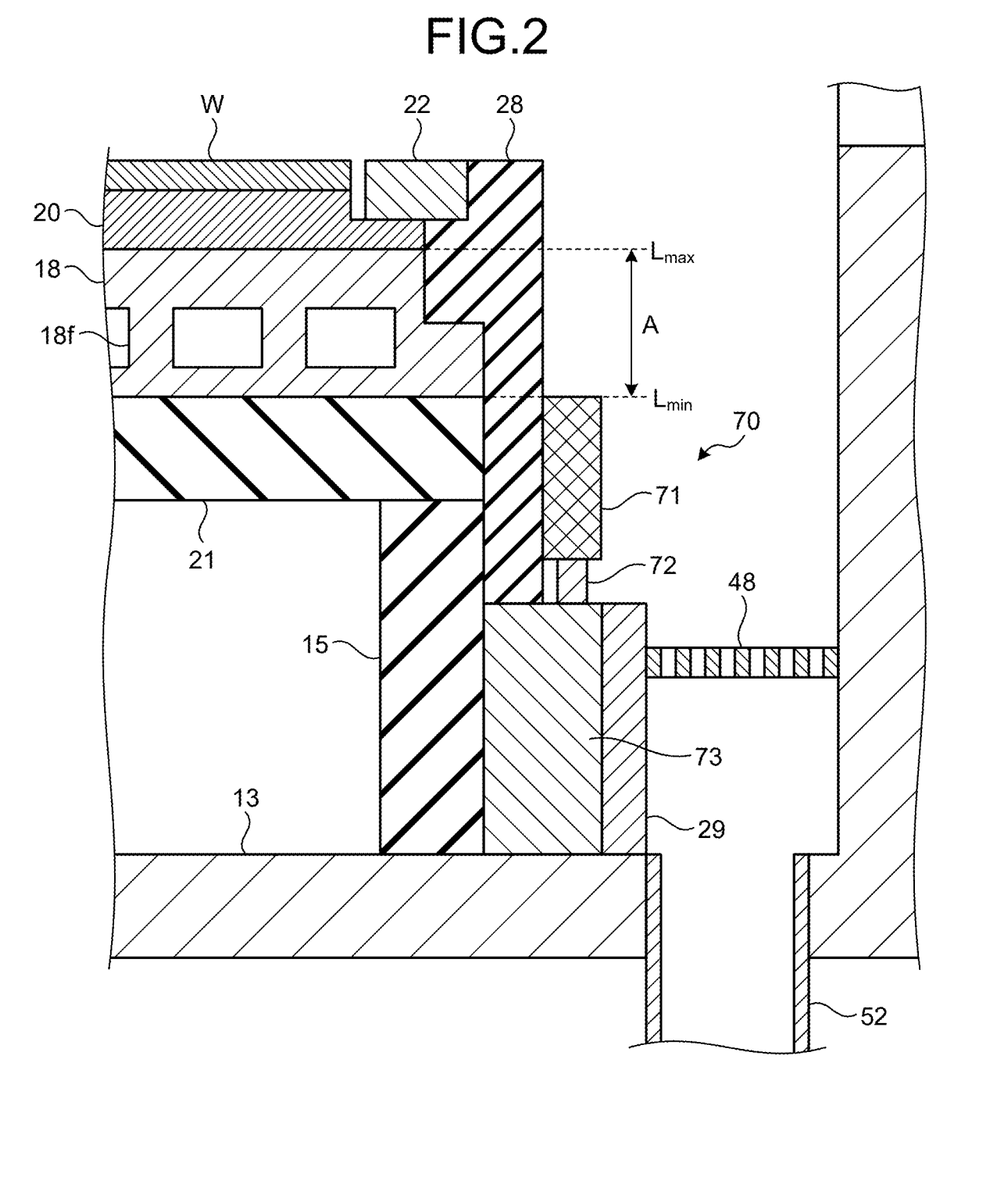
FIG. 2 is an enlarged cross-sectional view illustrating an example of an edge adjustment mechanism.
Figure 3:
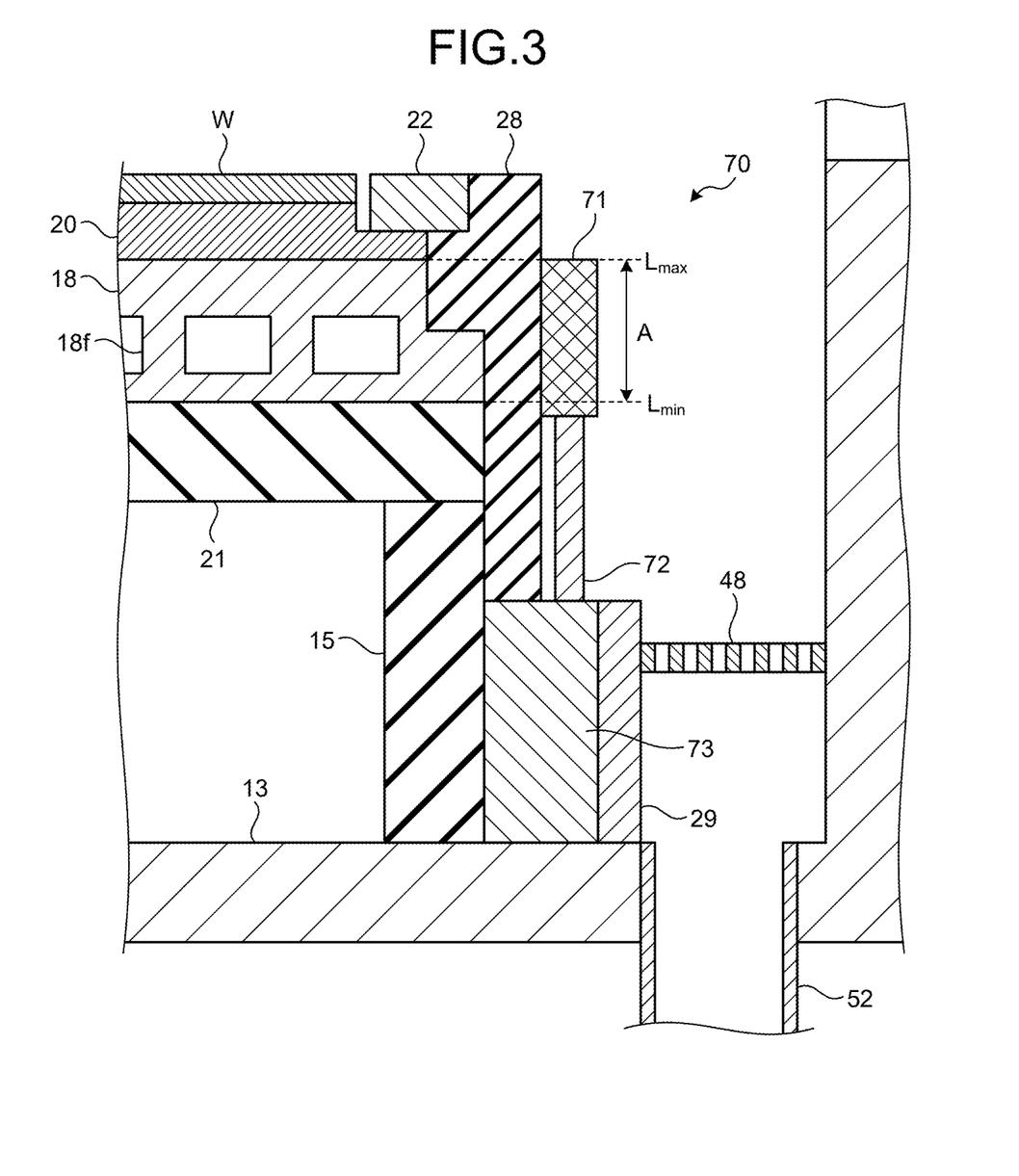
FIG. 3 is an enlarged cross-sectional view illustrating an example of an edge adjustment mechanism.

FIGS. 2 and 3 are enlarged cross-sectional views illustrating an example of the edge adjustment mechanism 70. The edge adjustment mechanism 70 includes a metal member 71, a support rod 72, and a driving unit 73. FIGS. 2 and 3 omits illustration of the internal structure of the driving unit 73. The metal member 71 is formed of a conductive material into a substantially cylindrical shape. The support rod 72 supports the metal member 71 from below. The support rod 72 is formed of a conductive material. The driving unit 73 has a power source such as a stepping motor, and moves the support rod 72 up and down. Linked with the up-down movement of the support rod 72, the metal member 71 moves up and down along the outer wall of the cover 28. The driving unit 73 includes a member formed of a conductive material. The metal member 71 is grounded via the support rod 72, the driving unit 73, and the bottom of the case 13.

In the present embodiment, the driving unit 73 moves the support rod 72 up and down thereby moving the metal member 71 up and down at least within a range A from a position $L_{min}$ at which the upper end of the metal member 71 comes at a same height as the lower surface of the lower electrode 18 to a position $L_{max}$ at which the upper end of the metal member 71 comes at a same height as the upper surface of the lower electrode 18. For example, three or more sets of the support rod 72 and the driving unit 73 are provided around the cover 28. The driving unit 73 is controlled by the control device 11.

Moving the metal member 71 so that the upper end of the metal member 71 moves from the position $L_{min}$ to the position $L_{max}$ will increase an area in which the outer wall of the lower electrode 18 and the metal member 71 overlap each other when viewed in a direction intersecting the surface of the outer wall of the lower electrode 18. Hereinafter, the state in which the upper end of the metal member 71 is at the position $L_{min}$ at the same height as the lower surface of the lower electrode 18 will be described as a state in which the metal member 71 is at the position $L_{min}$. In addition, hereinafter, the state in which the upper end of the metal member 71 is at the position $L_{max}$ at the same height as the upper surface of the lower electrode 18 will be described as a state in which the metal member 71 is at the position $L_{max}$.

For example, as illustrated in FIG. 2, the state in which the metal member 71 is located at the position $L_{min}$ allows the area in which the outer wall of the lower electrode 18 and the metal member 71 overlap each other when viewed in a direction intersecting the surface of the outer wall of the lower electrode 18 to be a minimum area. In contrast, as illustrated in FIG. 3, the state in which the metal member 71 is located at the position $L_{max}$ allows the area in which the outer wall of the lower electrode 18 and the metal member 71 overlap each other when viewed in a direction intersecting the surface of the outer wall of the lower electrode 18 to be a maximum area.

Return to FIG. 1 to continue the explanation. The apparatus body 10 includes an upper electrode 30. The upper electrode 30 is arranged above the support base 16 and is supported by the case 13 via a member 32 formed of an insulating material. The upper electrode 30 has a top plate 34 and a top plate support portion 36. The lower surface of the top plate 34 faces the internal space 12s. The top plate 34 has a plurality of gas discharge holes 34a penetrating the top plate 34 in a thickness direction. The top plate 34 is formed of, for example, silicon or the like. Furthermore, the top plate 34 may be formed of aluminum or the like having a plasma-resistant coating on its surface, for example.

The top plate support portion 36 detachably supports the top plate 34. The top plate support portion 36 is formed of a conductive material such as aluminum. The top plate support portion 36 internally includes a gas diffusion chamber 36a. A plurality of gas holes 36b extends downward from the gas diffusion chamber 36a. The gas hole 36b communicates with the gas discharge hole 34a. The top plate support portion 36 is provided with a gas introduction port 36c connected to the gas diffusion chamber 36a. The gas introduction port 36c is connected to a pipe 38.

The pipe 38 is connected to a gas source group 40 via a valve group 43, a flow volume controller group 42, and a valve group 41. The gas source group 40 includes a plurality of gas sources to supply the gas contained in the etching gas. The valve group 41 and the valve group 43 individually include a plurality of valves (for example, an on-off valve). The flow volume controller group 42 includes a plurality of flow volume controllers such as a mass flow controller.

Each of gas sources included in the gas source group 40 is connected to the pipe 38 via a corresponding valve in the valve group 41, a corresponding flow volume controller in the flow volume controller group 42, and a corresponding valve in the valve group 43. The gas from one or more gas sources selected from the plurality of gas sources included in the gas source group 40 is supplied into the gas diffusion chamber 36a of the top plate support portion 36 at an individually adjusted flow volume. The gas supplied into the gas diffusion chamber 36a diffuses in the gas diffusion chamber 36a and is supplied like a shower into the internal space 12s through the gas hole 36b and the gas discharge hole 34a.

Between the cover 29 and the inner wall surface of the case 13, there is provided a baffle plate 48 formed of aluminum or the like having a plasma-resistant coating on the surface. The baffle plate 48 has a plurality of through holes penetrating in the thickness direction. The bottom of the case 13 below the baffle plate 48 is connected to an exhaust pipe 52. The exhaust pipe 52 is connected to an exhaust device 50 having a pressure controller such as an automatic pressure control valve and a vacuum pump such as a turbo molecular pump. The exhaust device 50 can be used to reduce the pressure in the internal space 12s to a predetermined pressure.

The lower electrode 18 is connected to a first radio frequency (RF) power supply 61 via a first matcher 63. The first RF power supply 61 is a power supply that generates the first RF power for plasma generation. The frequency of the first RF power is a frequency in the range of 27 [MHz] to 100 [MHz], for example, a frequency of 60 [MHz]. The first matcher 63 has a matching circuit for achieve matching between the output impedance of the first RF power supply 61 and the impedance on the load side (lower electrode 18 side). The first RF power supply 61 may be connected via the first matcher 63 to the upper electrode 30 instead of the lower electrode 18.

Furthermore, the lower electrode 18 is also connected to a second RF power supply 62 via a second matcher 64. The second RF power supply 62 is a power supply that generates a second RF power for bias for drawing ions into the substrate W. The frequency of the second RF power is lower than the frequency of the first RF power. The frequency of the second RF power is a frequency in the range of 400 [kHz] to 13.56 [MHz], for example, a frequency of 400 [kHz]. The second matcher 64 has a matching circuit for achieve matching between the output impedance of the second RF power supply 62 and the impedance on the load side (lower electrode 18 side).

The control device 11 has a memory, a processor, and an input/output interface. The memory stores programs and data such as recipes. Examples of the memory include a random access memory (RAM), a read only memory (ROM), a hard disk drive (HDD), and a solid state drive (SSD). With execution of the program read from the memory, the processor controls individual components of the apparatus body 10 via the input/output interface based on the data such as the recipe stored in the memory. Examples of the processor include a central processing unit (CPU) and a digital signal processor (DSP).

In a case where plasma etching is performed by the plasma processing apparatus 1, the gate valve 12g is opened, and the substrate W is placed on the electrostatic chuck 20 by a transfer robot (not illustrated). Subsequently, the gas in the case 13 is exhausted by the exhaust device 50, one or more types of gases from the gas source group 40 are supplied into the chamber 12 at each of predetermined flow volumes, and the pressure in the chamber 12 is adjusted to a predetermined pressure.

Subsequently, the first RF power from the first RF power supply 61 and the second RF power from the second RF power supply 62 are supplied to the lower electrode 18. With this, an RF electric field is formed between the upper electrode 30 and the lower electrode 18, thereby turning the gas supplied into the chamber 12 into plasma. Subsequently, the substrate W is etched by ions, radicals, or the like contained in the plasma generated in the chamber 12.

Change in Ion Incident Direction

Figure 4A:
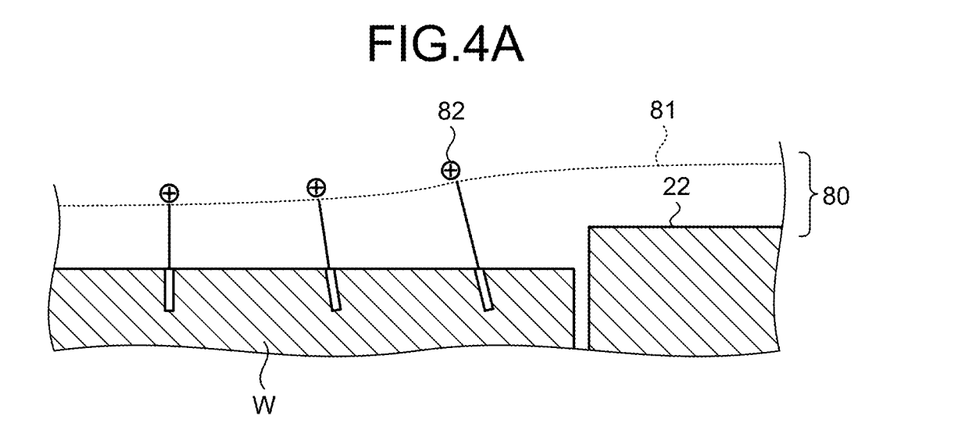
FIG. 4A is a schematic view illustrating an example of a sheath area near an edge of a substrate.

Here, in a case where the upper surface of the edge ring 22 is higher than the upper surface of the substrate W on the electrostatic chuck 20, the distribution of a boundary 81 of a sheath area 80 is as illustrated in FIG. 4A, for example. In this case, in the vicinity of the edge of the substrate W, the incident direction of the ions 82 in the plasma is inclined toward the edge side of the substrate W. The state in which the incident direction of the ions 82 is tilted toward the edge side of the substrate W is defined as outer tilt.

Figure 4B:
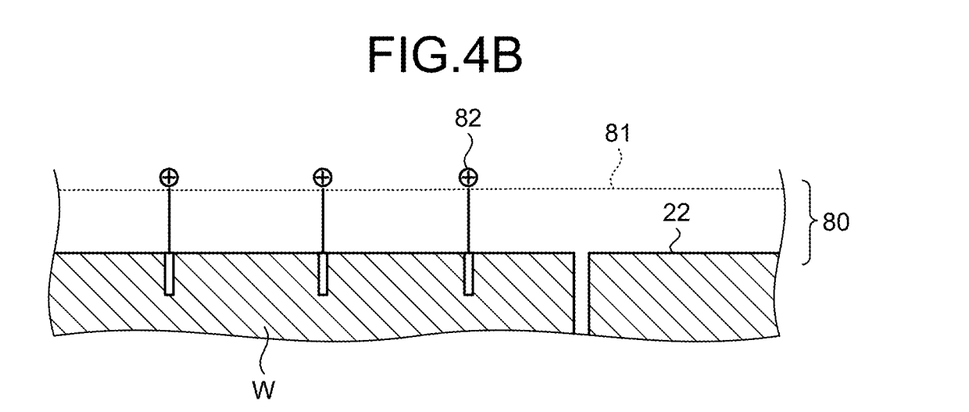
FIG. 4B is a schematic view illustrating an example of a sheath area near an edge of a substrate.

Furthermore, in a case where the upper surface of the edge ring 22 is at the same height as the upper surface of the substrate W on the electrostatic chuck 20, the distribution of the boundary 81 of the sheath area 80 is as illustrated in FIG. 4B, for example. In this case, even in the vicinity of the edge of the substrate W, the incident direction of the ions 82 in the plasma is substantially perpendicular to the substrate W.

Figure 4C:
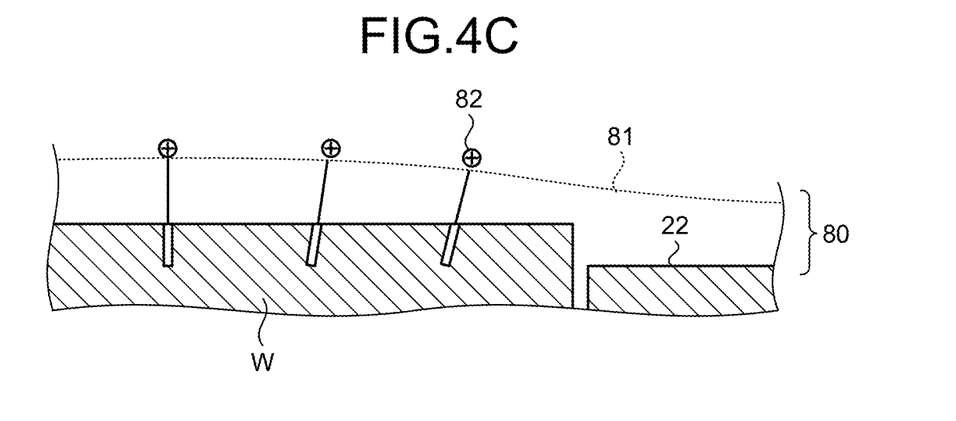
FIG. 4C is a schematic view illustrating an example of a sheath area near an edge of a substrate.

Furthermore, in a case where the upper surface of the edge ring 22 is lower than the upper surface of the substrate W on the electrostatic chuck 20, the distribution of the boundary 81 of the sheath area 80 is as illustrated in FIG. 4C, for example. In this case, in the vicinity of the edge of the substrate W, the incident direction of the ions 82 in the plasma is inclined toward the center of the substrate W. The state in which the incident direction of the ions 82 is tilted toward the center of the substrate W is defined as inner tilt.

The edge ring 22 exposed to the plasma wears with the passage of time of execution of the plasma processing. The wear of the edge ring 22 makes the edge ring 22 thinner, which lowers the boundary 81 of the sheath area 80 above the edge ring 22. This leads to the distribution of the sheath area 80 boundary 81 as illustrated in FIG. 4C, for example, and eventually the inclination of the holes and trenches formed in the substrate W would not satisfy the specifications. This leads to the necessity of replacing the edge ring 22 before the inclination of the hole or trench formed in the substrate W goes outside the specifications.

Incidentally, there is a correlation between the time length of execution of the plasma processing and the amount of wear of the edge ring 22. That is, the longer the time of execution of plasma processing, the greater the amount of wear of the edge ring 22. Accordingly, the amount of wear of the edge ring 22 can be estimated from the cumulative time of execution of the plasma processing.

Furthermore, the incident angle of the ion 82 correlates with an edge drop (ED) value calculated based on the distribution of the etching rate (ER) in the vicinity of the edge of the substrate W. The small ED value results in the inner tilt of the incident angle of the ion 82; the large ED value results in the outer tilt of the incident angle of the ion 82.

The ED value is calculated by the following calculation formula, for example.

$$ED\ value = ER(R=R_1[mm]) - ER(R=R_2[mm])$$

In the above calculation formula, ER (R=X [mm]) represents an etching rate at a position X [mm] away from the center of the substrate W. In the present embodiment, $R_1$ is, for example, 135 [mm] and $R_2$ is, for example, 147 [mm] or 149 [mm].

The occurrence of wear in the edge ring 22 leads to a state in which the upper surface of the edge ring 22 is lower than the upper surface of the substrate W on the electrostatic chuck 20 as illustrated in FIG. 4C, for example, causing inner tilt in the incident direction of the ions 82 and a small ED value. When an increase in the ED value can be achieved, the incident direction of the ion 82 can be inclined in a direction of outer tilting even in the case of occurrence of wear of the edge ring 22, and this leads to suppression of out-of-spec formation of the inclination of the holes and trenches formed in the substrate W. This makes it possible to extend the replacement cycle of the edge ring 22, leading to improvement of the throughput of the process.

Relationship Between Position of the Metal Member 71 and Distribution of ER

Figure 5:
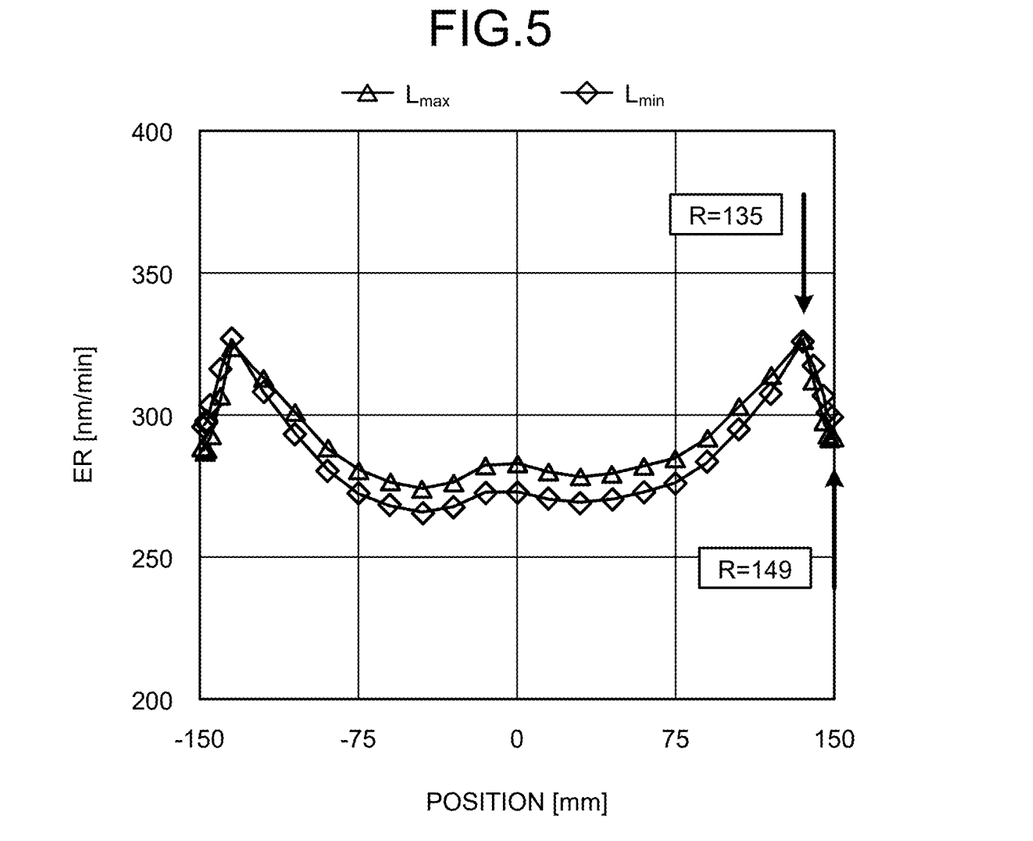
FIG. 5 is a diagram illustrating an example of distribution of etching rate (ER) of a substrate.
Figure 6:
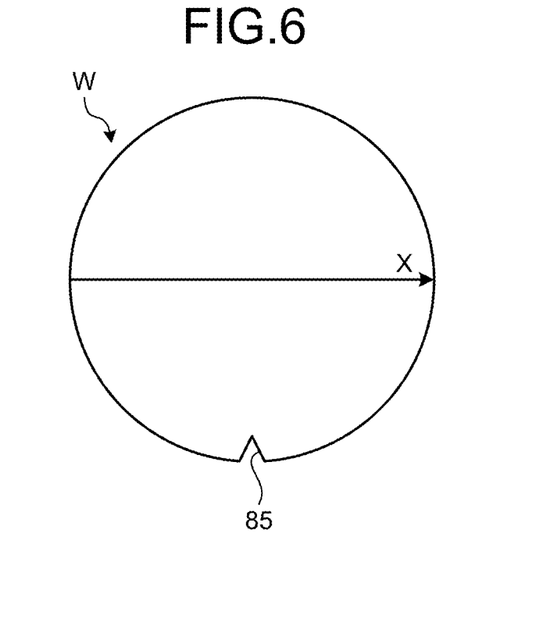
FIG. 6 is a diagram illustrating a measurement direction of distribution of ER illustrated in FIG. 5.

FIG. 5 is a diagram illustrating an example of a distribution of ER on the substrate W. FIG. 5 illustrates the distribution of ER in the X-axis direction in a case where a direction that would not interfere with a notch 85 provided in the substrate W is defined as the X-axis, as illustrated in FIG. 6, for example. For example, as illustrated in FIG. 5, the inclination of the ER in the vicinity of the edge of the substrate W is different between a state where the metal member 71 is at the position $L_{min}$ and a state where the metal member 71 is at the position $L_{max}$.

Figure 7:
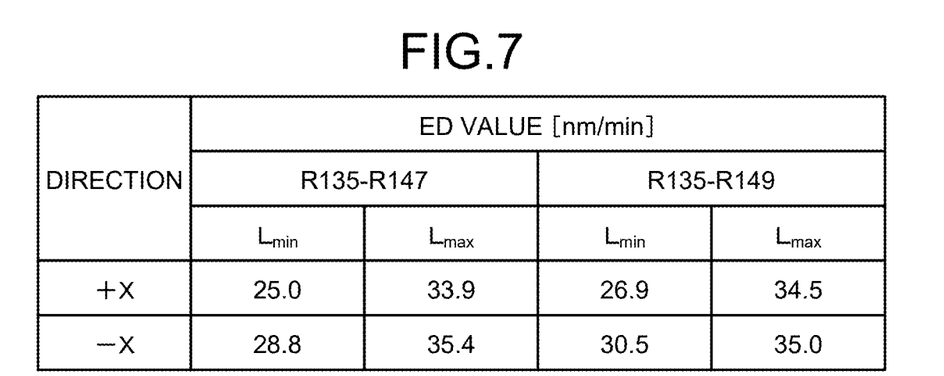
FIG. 7 is a diagram illustrating an example of an edge drop (ED) value calculated from the distribution of ER in FIG. 5.

FIG. 7 is a diagram illustrating an example of the edge drop (ED) value calculated from the distribution of ER in FIG. 5. In FIG. 7, "R135-R147" indicates ED values at a position 135 [mm] away from the center of the substrate W and at a position 147 [mm] away from the center of the substrate W. Furthermore, in FIG. 7, "R135-R149" indicates ED values at a position 135 [mm] away from the center of the substrate W and at a position 149 [mm] away from the center of the substrate W.

Referring to FIG. 7, the ED value when the metal member 71 is at the position $L_{max}$ is larger than the ED value when the metal member 71 is at the position $L_{min}$ in both the +X direction and the −X direction. That is, by raising the metal member 71 so as to increase the area in which the outer wall of the lower electrode 18 and the metal member 71 overlap each other when viewed in a direction intersecting the surface of the outer wall of the lower electrode 18, it is possible to increase the ED value. With an increased ED value, it is possible to return the incident direction of the ion 82 inclined toward the inner tilt due to the wear of the edge ring 22 to the outer tilt side.

Therefore, the control device 11 controls the driving unit 73 to raise the metal member 71 in accordance with the length of the cumulative time of execution of plasma processing so as to increase the area in which the outer wall of the lower electrode 18 and the metal member 71 overlap each other when viewed in the direction intersecting the surface of the outer wall of the lower electrode 18. This makes it possible to suppress an increase in the inclination of the ion 82 toward the inner tilt side in the incident direction, leading to suppression of the out-of-spec formation of the inclination of the holes and trenches formed in the substrate W. This makes it possible to extend the replacement cycle of the edge ring 22, leading to improvement of the throughput of the process.

Plasma Processing Method

Figure 8:
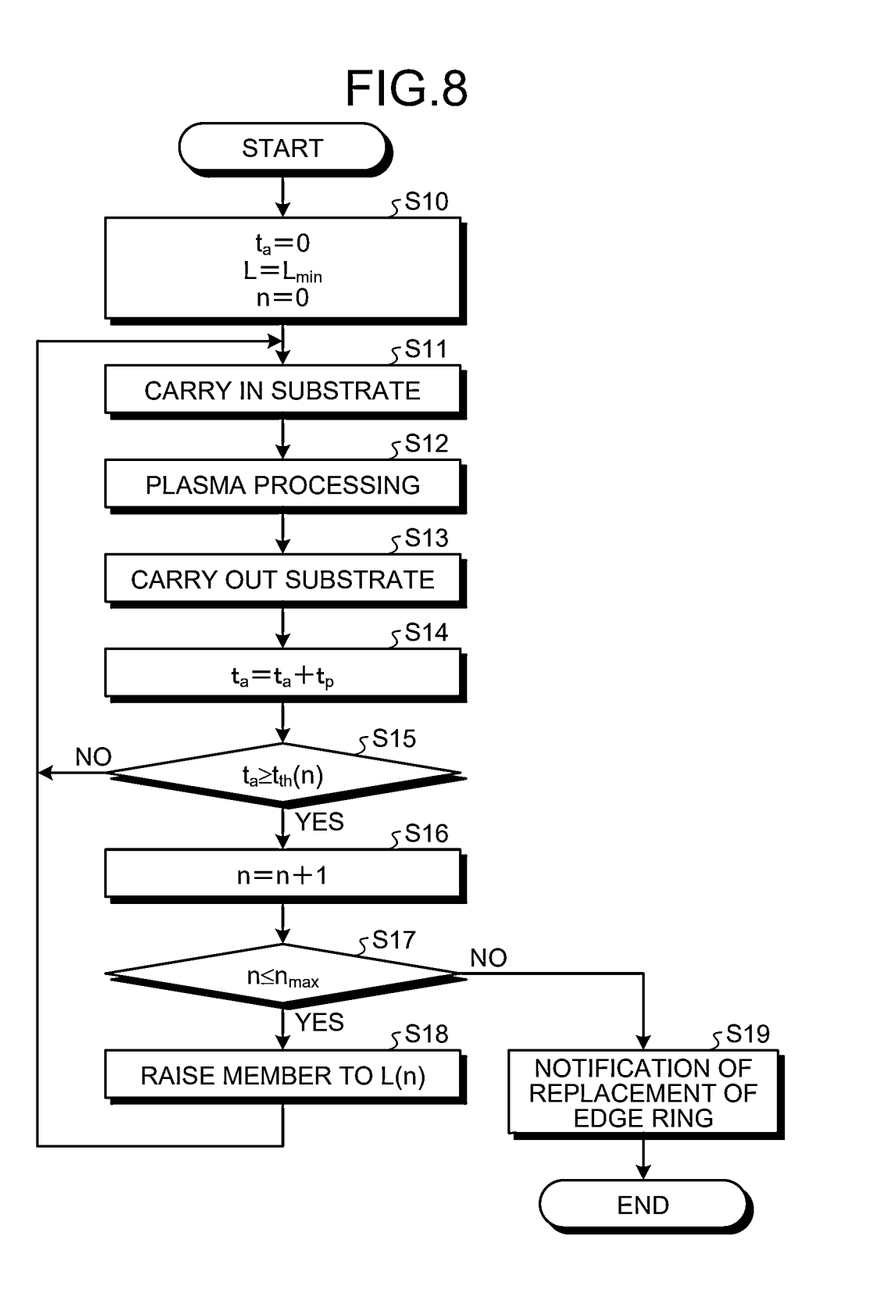
FIG. 8 is a flowchart illustrating an example of a plasma processing method.

FIG. 8 is a flowchart illustrating an example of a plasma processing method. The plasma processing method illustrated in FIG. 8, can be implemented by the processor in the control device 11, specifically, in a manner such that the processor reads out the program stored in the memory in the control device 11 and executes the program, and controls individual components of the apparatus body 10 via the input/output interface in the control device 11.

Figure 9:
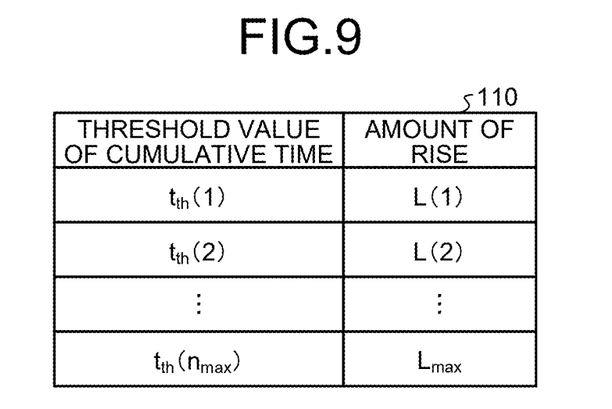
FIG. 9 is a diagram illustrating an example of a control table.

Incidentally, the memory of the control device 11 preliminarily stores a control table 110 as illustrated in FIG. 9, for example. FIG. 9 is a diagram illustrating an example of the control table 110. The control table 110 stores the amounts of rise of the metal member 71 in association with threshold values of the cumulative time of plasma processing.

First, the control device 11 initializes each of parameters used for the treatment (S10). In step S10, a cumulative time $t_a$ of the plasma processing is initialized to 0, an amount of rise L of the metal member 71 is initialized to the minimum value $L_{min}$, and a variable n is initialized to 0.

Next, the substrate W is carried into the chamber 12 (S11). In step S11, after the gate valve 12g is opened, the substrate W is carried into the case 13 by a transfer robot (not illustrated) and then placed on the electrostatic chuck 20. Subsequently, the gate valve 12g is closed.

Next, plasma processing is performed (S12). In step S12, the exhaust device 50 exhausts the gas in the chamber 12, the gas source group 40 supplies the etching gas into the chamber 12, and the pressure in the chamber 12 is adjusted to a predetermined pressure. Subsequently, the first RF power and the second RF power are supplied to the lower electrode 18. This allows the etching gas supplied into the chamber 12 to turn into plasma, and the substrate W placed on the electrostatic chuck 20 is etched by the active species, ions, and the like contained in the plasma.

After completion of the plasma processing, the gas in the chamber 12 is exhausted by the exhaust device 50, the gate valve 12g is opened, and the substrate W is carried out from the chamber 12 by a transfer robot (not illustrated) (S13).

Next, the control device 11 adds a plasma processing time $t_p$ in step S12 to the cumulative time $t_a$ of plasma processing (S14). There is a correlation between the cumulative time $t_a$ of the plasma processing and the amount of wear of the edge ring 22, and thus, the amount of wear in the edge ring 22 is estimated based on the cumulative time $t_a$ of the plasma processing in the present embodiment. Step S14 is an example of an estimation step.

Next, the control device 11 acquires the nth threshold value $t_{th}$ (n) from the control table 110. Subsequently, the control device 11 determines whether the cumulative time $t_a$ is the threshold value $t_{th}$ (n) or more (S15). In a case where the cumulative time $t_a$ is less than the threshold value $t_{th}$ (n) (S15: No), the control device 11 executes the process illustrated in step S11 again.

In contrast, in a case where the cumulative time $t_a$ is the threshold value $t_{th}$ (n) or more (S15: Yes), the control device 11 increments the variable n by 1 (S16) and determines whether the value of the variable n is a maximum value $n_{max}$ or less (S17).

In a case where the value of the variable n is the maximum value $n_{max}$ or less (S17: Yes), the control device 11 acquires an nth amount of rise L (n), from the control table 110. Subsequently, the control device 11 controls the driving unit 73 so as to raise the metal member 71 to the position indicated by the amount of rise L(n) (S18). Step S18 is an example of a control step. These procedures return the inclination of the ion 82 in the incident direction to the outer tilt side. Subsequently, the control device 11 executes the process illustrated in step S11 again.

In contrast, in a case where the value of the variable n is larger than the maximum value $n_{max}$ (S17: No), the metal member 71 has already risen to the maximum value $L_{max}$. Therefore, the control device 11 notifies the user of the plasma processing apparatus 1 that the edge ring 22 needs replacement via a display device (not illustrated) or the like (S19). The control device 11 ends the process illustrated in this flowchart.

The embodiment has been described as above. As described above, the plasma processing apparatus 1 in the present embodiment includes the chamber 12, the lower electrode 18, the electrostatic chuck 20, the edge ring 22, the metal member 71, the driving unit 73, and the control device 11. Plasma is generated inside the chamber 12. The lower electrode 18 is provided in the chamber 12. The electrostatic chuck 20 is provided on the lower electrode 18, on which the substrate W is placed. The edge ring 22 is provided around the electrostatic chuck 20. The metal member 71 is disposed along the outer wall of the lower electrode 18 and is grounded. The driving unit 73 moves the metal member 71 along the outer wall of the lower electrode 18. The control device 11 controls the driving unit 73 to move the metal member 71 so as to increase the area in which the outer wall of the lower electrode 18 and the metal member 71 overlap each other when viewed in the direction intersecting the surface of the outer wall of the lower electrode 18 in accordance with the increase in the amount of wear of the edge ring 22. With this control, it is possible to suppress an increase in the inclination of the ion 82 in the incident direction toward the inner tilt side with the passage of time of execution of plasma processing, leading to suppression of out-of-spec formation of the inclination of the holes and trenches formed in the substrate W. This makes it possible to extend the replacement cycle of the edge ring 22, leading to improvement of the throughput of the process.

Furthermore, in the above-described embodiment, the control device 11 controls the driving unit 73 so as to move the metal member 71 to increase the area in which the outer wall of the lower electrode 18 and the metal member 71 overlap each other in accordance with the length of the cumulative time of plasma generation in the chamber 12. With this control, it is possible to suppress an increase in the inclination of the ion 82 in the incident direction toward the inner tilt side with the passage of time of execution of plasma processing.

Furthermore, in the above-described embodiment, the control device 11 executes the estimation step and the control step. The estimation step estimates the amount of wear of the edge ring 22. The control step controls the driving unit 73 to move the metal member 71 so as to increase the area in which the outer wall of the lower electrode 18 and the metal member 71 overlap each other when viewed in the direction intersecting the surface of the outer wall of the lower electrode 18 in accordance with the increase in the amount of wear of the edge ring 22. With this control, it is possible to suppress an increase in the inclination of the ion 82 in the incident direction toward the inner tilt side with the passage of time of execution of plasma processing, leading to suppression of out-of-spec formation of the inclination of the holes and trenches formed in the substrate W. This makes it possible to extend the replacement cycle of the edge ring 22, leading to improvement of the throughput of the process.

Others

The technique disclosed in the present application is not limited to the above-described embodiments, and various modifications can be made within the scope and spirit of the present application.

Figure 10:
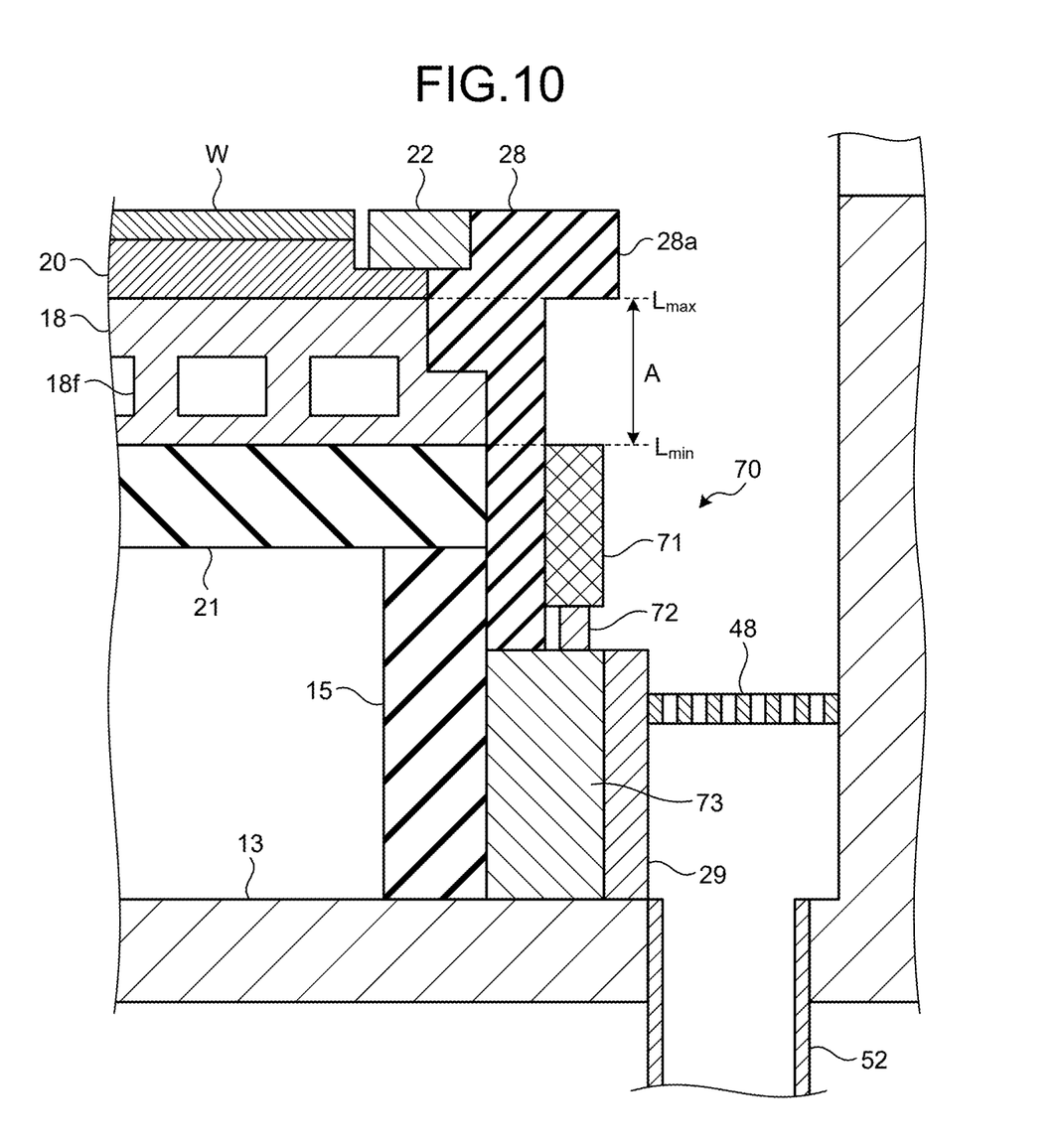
FIG. 10 is a view illustrating another example of a cover.

For example, the cover 28 provided around the support base 16 may have a shape as illustrated in FIG. 10, for example. FIG. 10 is a diagram illustrating another example of the cover 28. In the example of FIG. 10, the cover 28 is provided with a protrusion 28a that protrudes upward from the metal member 71. With this structure, the metal member 71 is protected against the ion 82 or the like incident on the substrate W from the plasma generated above the substrate W. With this structure, it is possible to suppress the wear of the metal member 71.

Figure 11:
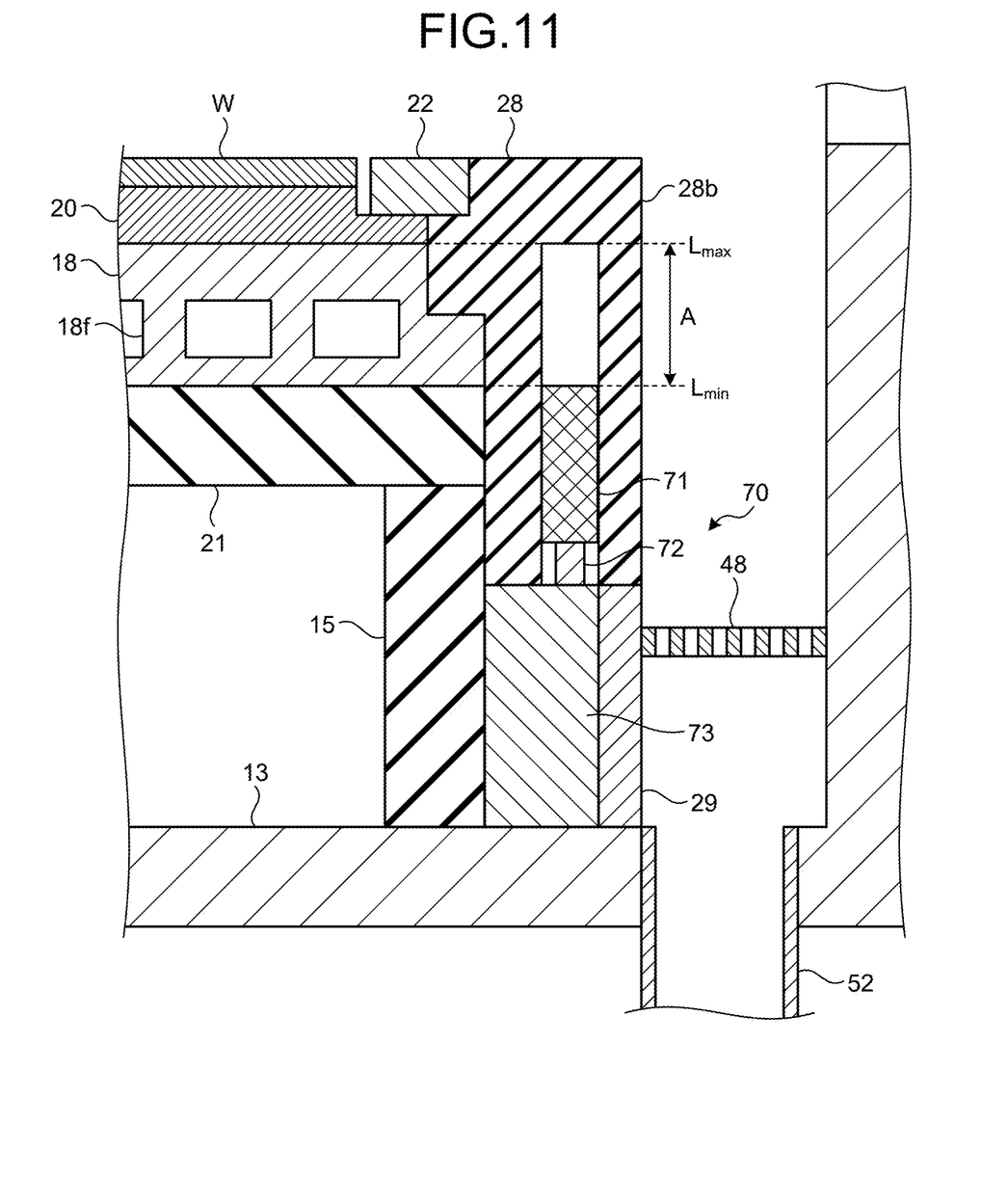
FIG. 11 is a diagram illustrating another example of a cover.

Furthermore, the cover 28 provided around the support base 16 may have a shape as illustrated in FIG. 11, for example. FIG. 11 is a diagram illustrating another example of the cover 28. In the example of FIG. 11, the cover 28 is provided with a tubular portion 28b that covers the metal member 71 within a movement range of the metal member 71. This makes it possible to reduce the damage to the metal member 71 due to the ion 82 or active species existing in the vicinity of the baffle plate 48. This also can suppress reaction by-products adhering to the metal member 71 and the support rod 72, making is possible to maintain smooth movement of the metal member 71 and the support rod 72.

Furthermore, the above-described embodiment is an example in which one metal member 71 having a substantially cylindrical shape is arranged around the support base 16. However, the disclosed technique is not limited to this. For example, the metal member 71 may be divided into a plurality of blocks in a direction intersecting the moving direction of the metal member 71. The metal member 71 of each of blocks includes at least one support rod 72 and a driving unit 73, enabling each of the blocks to move independently of each other. With this configuration, even when the amount of wear in the edge ring 22 is different in the circumferential direction of the substrate W, it would be possible to adjust the ED value independently for each of the blocks, enabling suppression of out-of-spec formation of the inclination of the holes and trenches formed in the substrate W.

Furthermore, the above-described embodiment is an example in which the amount of wear in the edge ring 22 is estimated based on the cumulative time of the plasma processing, and the amount of rise of the metal member 71 is controlled in accordance with the cumulative time of the plasma processing. However, the disclosed technique is not limited to this. For example, the amount of wear in the edge ring 22 may be estimated based on the weight, the electric resistance value, and the like of the edge ring 22, and the amount of rise of the metal member 71 may be controlled in accordance with the weight, the electric resistance value, and the like of the edge ring 22. Alternatively, the actual thickness of the edge ring 22 may be measured and the amount of rise of the metal member 71 may be controlled in accordance with the measured thickness.

Furthermore, the above-described embodiment is an example in which the value of the amount of rise of the edge ring 22 takes a discrete value in accordance with the length of the cumulative time of the plasma processing. However, the disclosed technique is not limited to this example. For example, the edge ring 22 may be continuously raised in accordance with the length of the cumulative time of the plasma processing.

According to the various aspects and embodiments of the present disclosure, it is possible to suppress variation of inclination of holes and trenches formed in the substrate due to wear of the edge ring.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A plasma processing apparatus comprising:
a chamber in which plasma is generated;
a lower electrode provided in the chamber; an electrostatic chuck provided on the lower electrode and on which a substrate is placed;
an edge ring provided around the electrostatic chuck;
a metal member that is arranged along an outer wall of the lower electrode and is grounded;
a driver that includes a mechanical power source that moves the metal member along the outer wall of the lower electrode; and
a controller having at least one processor and a memory with a computer readable program stored therein that upon execution of the computer readable program by the processor configures the controller to
control the driver to maintain a height of the metal member during plasma processing,
calculate an amount of wear of the edge ring based on a cumulative time of the plasma processing, and
calculate an edge drop value based on a distribution of the etching rate (ER) in the vicinity of the edge of the substrate,
control the driver after plasma processing to move the metal member so as to increase an area in which the lower electrode and the metal member overlap each other when viewed in a direction intersecting a surface of the outer wall of the lower electrode based on the calculated amount of wear of the edge ring, to cause an incident angle of ions generated in the plasma to tilt toward an edge side of the substrate,
wherein the incident angle of the ions correlates with the edge drop value of the edge ring and the increase in the area in which the lower electrode and the metal member overlap each other when viewed in a direction intersecting a surface of the outer wall of the lower electrode increases the edge drop value calculated.

2. The plasma processing apparatus according to claim 1, wherein the controller controls the driver so as to move the metal member to increase the area in which the lower electrode and the metal member overlap each other in accordance with a length of a cumulative time of plasma generation in the chamber.

3. The plasma processing apparatus according to claim 1, further comprising a cover that covers the metal member against plasma.

4. The plasma processing apparatus according to claim 1, further comprising a cover that covers the metal member to protect against damage from plasma.

5. The plasma processing apparatus according to claim 1, wherein the generated plasma is a capacitively coupled plasma (CCP).

6. The plasma processing apparatus according to claim 5, further comprising a radio frequency (RF) power supply that is coupled to the lower electrode.

7. A plasma processing apparatus comprising:
a chamber in which plasma is generated;
a lower electrode provided in the chamber;
a bias power source coupled to the lower electrode;
an electrostatic chuck provided on the lower electrode and on which a substrate is placed;
an edge ring provided around the electrostatic chuck;
a metal member that is arranged along an outer wall of the lower electrode and is grounded;
a driver that includes a mechanical power source that moves the metal member along the outer wall of the lower electrode; and
a controller having at least one processor and a memory with a computer readable program stored therein that upon execution of the computer readable program by the processor configures the controller to
control the driver to maintain a height of the metal member during plasma processing,
calculate an amount of wear of the edge ring based on a cumulative time of the plasma processing, and
calculate an edge drop value based on a distribution of the etching rate (ER) in the vicinity of the edge of the substrate,
control the driver after plasma processing to move the metal member so as to increase an area in which the lower electrode and the metal member overlap each other when viewed in a direction intersecting a surface of the outer wall of the lower electrode based on the calculated amount of wear of the edge ring, to cause an incident angle of ions generated in the plasma to tilt toward an edge side of the substrate,
wherein the incident angle of the ions correlates with the edge drop value of the edge ring and the increase in the area in which the lower electrode and the metal member overlap each other when viewed in a direction intersecting a surface of the outer wall of the lower electrode increases the edge drop value calculated.

8. A plasma processing method applied in a plasma processing apparatus,
wherein the plasma processing apparatus includes:
a chamber in which plasma is generated;
a lower electrode provided in the chamber;
an electrostatic chuck provided on the lower electrode and on which a substrate is placed;
an edge ring provided around the electrostatic chuck;
a metal member that is arranged along an outer wall of the lower electrode and is grounded; a driver that includes a mechanical power source that moves the metal member along the outer wall of the lower electrode; and
a controller having at least one processor and a memory with a computer readable program stored therein that upon execution of the computer readable program by the processor configures the controller to perform the following method:
controlling the driver to maintain a height of the metal member during plasma processing,
calculating an amount of wear of the edge ring based on a cumulative time of the plasma processing;
controlling the driver after plasma processing to move the metal member so as to increase an area in which the lower electrode and the metal member overlap each other when viewed in a direction intersecting a surface of the outer wall of the lower electrode based on the calculated amount of wear of the edge ring, to cause an incident angle of ions generated in the plasma to tilt toward an edge side of the substrate; and calculating an edge drop value of the edge ring, wherein the incident angle of the ions correlates with the calculated edge drop value of the edge ring based on a distribution of the etching rate (ER) in the vicinity of the edge of the substrate and the increase in the area in which the lower electrode and the metal member overlap each other when viewed in a direction intersecting a surface of the outer wall of the lower electrode increases the edge drop value.

9. The plasma processing apparatus according to claim 1, wherein the mechanical power source comprises a stepping motor.

10. The plasma processing apparatus according to claim 1, wherein the at least one processor includes at least one of a central processing unit and a digital signal processor.

11. The plasma processing apparatus according to claim 7, wherein the mechanical power source comprises a stepping motor.

12. The plasma processing apparatus according to claim 7, wherein the at least one processor includes at least one of a central processing unit and a digital signal processor.

* * * * *